(12) United States Patent
Jin et al.

(10) Patent No.: US 11,367,498 B2
(45) Date of Patent: Jun. 21, 2022

(54) MULTI-LEVEL MEMORY HIERARCHY

(71) Applicant: Black Sesame International Holding Limited, Santa Clara, CA (US)

(72) Inventors: Xiangdong Jin, Mountain View, CA (US); Fen Zhou, Fremont, CA (US); Chengyu Xiong, San Jose, CA (US)

(73) Assignee: Black Sesame Technologies Inc., San Jose, CA (US)

( * ) Notice: Subject to any disclaimer, the term of this patent is extended or adjusted under 35 U.S.C. 154(b) by 101 days.

(21) Appl. No.: 16/287,727

(22) Filed: Feb. 27, 2019

(65) Prior Publication Data

US 2020/0082898 A1 Mar. 12, 2020

Related U.S. Application Data

(60) Provisional application No. 62/728,294, filed on Sep. 7, 2018.

(51) Int. Cl.

| | |
|---|---|
| *G11C 29/38* | (2006.01) |
| *G06F 3/06* | (2006.01) |
| *G06N 3/08* | (2006.01) |
| *G06N 3/04* | (2006.01) |
| *G11C 11/54* | (2006.01) |
| *G06F 9/50* | (2006.01) |
| *G06F 17/15* | (2006.01) |

(52) U.S. Cl.
CPC ............ *G11C 29/38* (2013.01); *G06F 3/0604* (2013.01); *G06F 3/0644* (2013.01); *G06F 3/0685* (2013.01); *G06N 3/084* (2013.01); *G06F 3/0688* (2013.01); *G06F 9/5061* (2013.01); *G06F 17/153* (2013.01); *G06F 2207/4824* (2013.01); *G06N 3/049* (2013.01); *G06N 3/0454* (2013.01); *G11C 11/54* (2013.01)

(58) Field of Classification Search
CPC ...... G06N 3/0454; G06N 3/049; G06N 3/084; G06F 2207/4824; G06F 3/0688; G06F 17/153; G06F 9/5061; G06F 3/0604; G06F 3/0644; G06F 3/0685; G11C 11/54; G11C 29/38
See application file for complete search history.

(56) References Cited

U.S. PATENT DOCUMENTS

| | | | |
|---|---|---|---|
| 10,411,709 B1* | 9/2019 | Ghasemi | G06N 3/0454 |
| 2012/0275246 A1* | 11/2012 | Kim | G11C 29/26 |
| | | | 365/194 |

(Continued)

*Primary Examiner* — April Y Blair
*Assistant Examiner* — Sazzad Hossain
(74) *Attorney, Agent, or Firm* — Timothy T. Wang; Ni, Wang & Massand, PLLC

(57) ABSTRACT

A method of hierarchical structuring a multi-level memory in a convolutional neural network, includes partitioning a memory into a plurality of sections, partitioning the plurality of sections into a plurality of stripes, utilizing input data from the plurality of stripes in a MAC array, outputting an intermediate result from the MAC array to at least one of the plurality of stripes of a result buffer, looping back the intermediate result from the at least one of the plurality of stripes of the result buffer to at least one of the plurality of stripes of an input data buffer and outputting a final result from the at least one of the plurality of stripes of the result buffer to at least one of the plurality of stripes of an output buffer.

9 Claims, 10 Drawing Sheets

(56) References Cited

U.S. PATENT DOCUMENTS

| | | | | |
|---|---|---|---|---|
| 2013/0151913 A1* | 6/2013 | Louie | ............ | G11C 29/04 |
| | | | | 714/718 |
| 2015/0199963 A1* | 7/2015 | Maaninen | ............ | G10L 15/16 |
| | | | | 704/232 |
| 2018/0032859 A1* | 2/2018 | Park | ............ | G06N 3/04 |
| 2018/0121796 A1* | 5/2018 | Deisher | ............ | G06N 3/0472 |
| 2018/0129935 A1* | 5/2018 | Kim | ............ | G06N 3/082 |
| 2018/0157966 A1* | 6/2018 | Henry | ............ | G06N 3/063 |
| 2019/0340486 A1* | 11/2019 | Mills | ............ | G06F 7/5443 |

* cited by examiner

MULTI-LEVEL MEMORY HIERARCHY

BACKGROUND

Technical Field

The instant disclosure is related to convolutional neural networks and specifically improving memory access efficiency of multiply accumulate.

BACKGROUND

Convolutional neural networks are at their core are frequent manipulators and accessors of data. The data that transits the network is used and reused in a continual rotation. Near the multiply accumulate layer this rotation of data quite often repeats. To use, address and store and then address and pull the data and reuse that same data represents an inefficiency in current systems. What is sought is a more efficient method of memory use and reuse. A method is sought to partition the memory into hierarchies depending on frequency of access, bandwidth, operational frequency and transit distance. A method is also sought to capture and store the data in ways that enable the system to more quickly access the data.

SUMMARY

A first example method of hierarchical structuring a multi-level memory in a convolutional neural network, includes at least one of partitioning a memory into a plurality of sections, partitioning the plurality of sections into a plurality of stripes, utilizing input data from the plurality of stripes in a multiply accumulate (MAC) array, outputting an intermediate result from the MAC array to at least one of the plurality of stripes of a result buffer, looping back the intermediate result from the at least one of the plurality of stripes of the result buffer to at least one of the plurality of stripes of an input data buffer and outputting a final result from the at least one of the plurality of stripes of the result buffer to at least one of the plurality of stripes of an output buffer.

A second example method of hierarchical structuring a multi-level memory in a convolutional neural network, including at least one of storing a width component of a data set so that a width component increases linearly in a first address direction in a memory array, storing a height component of the data set so that a height component increases linearly in a second address direction orthogonal to the first address direction in the memory array and storing a depth component of the data set so that a depth component increases linearly in a third address direction symmetric to the first address direction and the second address direction in the memory array.

A third example method of hierarchical structuring a multi-level memory in a convolutional neural network, including at least one of storing in a first memory a width component of a three dimensional data set so that the width component increases linearly through a first memory address space, storing in a second memory a height component of the three dimensional data set so that the height component increases linearly through a second memory address space and storing in a third memory a depth component of the three dimensional data set so that the depth component increases linearly through a third memory address space.

DETAILED DESCRIPTION OF THE INVENTION

The embodiments listed below are written only to illustrate the applications of this apparatus and method, not to limit the scope. The equivalent form of modifications towards this apparatus and method shall be categorized as within the scope the claims.

Certain terms are used throughout the following description and claims to refer to particular system components. As one skilled in the art will appreciate, different companies may refer to a component and/or method by different names. This document does not intend to distinguish between components and/or methods that differ in name but not in function.

In the following discussion and in the claims, the terms "including" and "comprising" are used in an open-ended fashion, and thus may be interpreted to mean "including, but not limited to . . . ." Also, the term "couple" or "couples" is intended to mean either an indirect or direct connection. Thus, if a first device couples to a second device that connection may be through a direct connection or through an indirect connection via other devices and connections.

Figure 1:
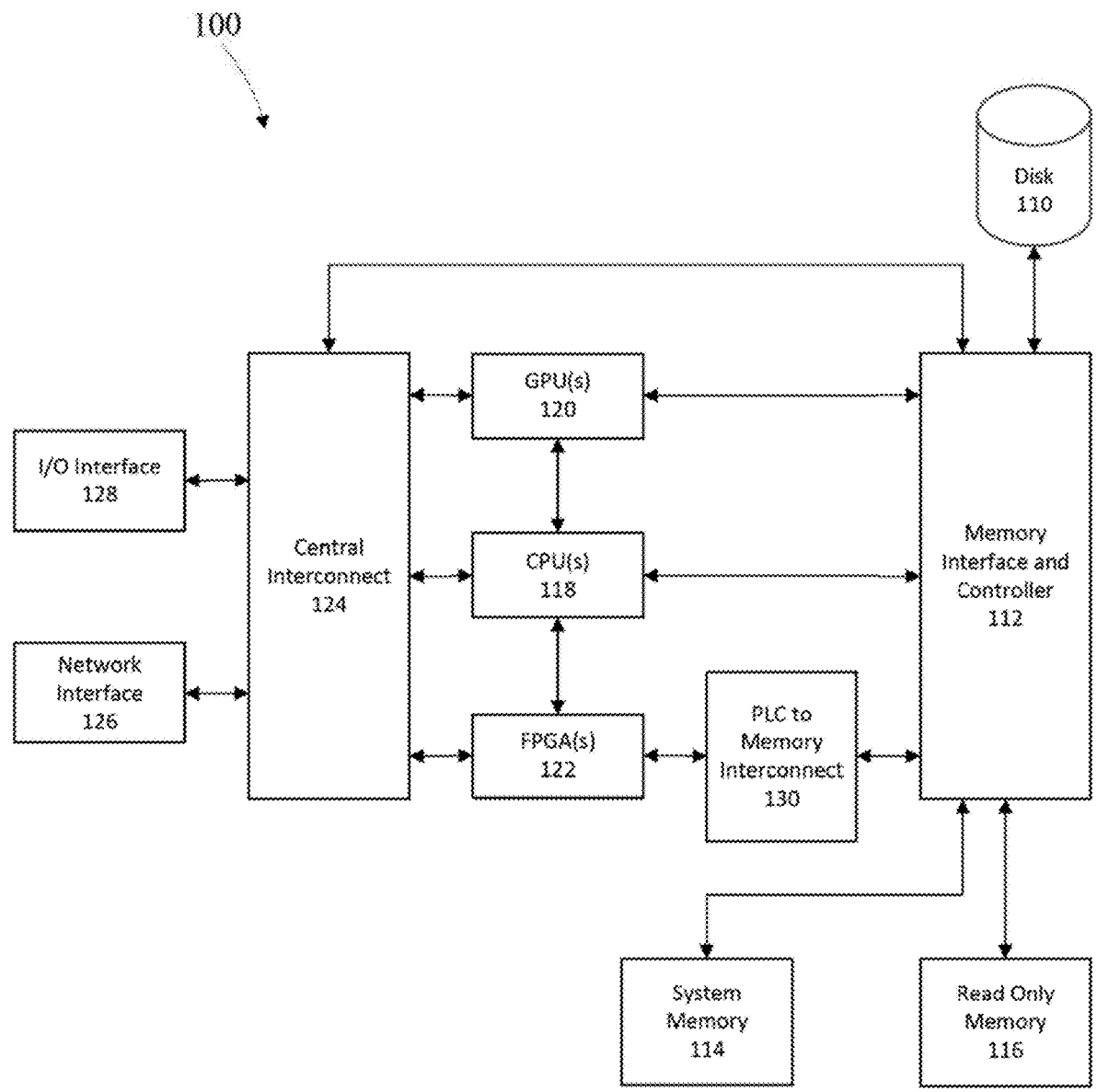
FIG. 1 is a first example system diagram in accordance with one embodiment of the disclosure.

FIG. 1 depicts an example hybrid computational system 100 that may be used to implement neural nets associated with the operation of one or more portions or steps of processes 800, 900 and 1000. In this example, the processors associated with the hybrid system comprise a field programmable gate array (FPGA) 122, a graphical processor unit (GPU) 120 and a central processing unit (CPU) 118.

The processing units 118, 120 and 122 have the capability of providing a neural net. A CPU is a general processor that may perform many different functions, its generality leads to the ability to perform multiple different tasks, however, its processing of multiple streams of data is limited and its function with respect to neural networks is very limited. A GPU is a graphical processor which has many small processing cores capable of processing parallel tasks in sequence. An FPGA is a field programmable device, it has the ability to be reconfigured and perform in hardwired circuit fashion any function that may be programmed into a CPU or GPU. Since the programming of an FPGA is in circuit form, its speed is many times faster than a CPU and appreciably faster than a GPU.

There are other types of processors that the system may encompass such as an accelerated processing unit (APUs) which comprise a CPU with GPU elements on chip and digital signal processors (DSPs) which are specialized for performing high speed numerical data processing. Application specific integrated circuits (ASICs) may also perform the hardwired functions of an FPGA; however, the lead time to design and produce an ASIC is on the order of quarters of a year, not the quick turn-around implementation that is available in programming an FPGA.

The graphical processor unit 120, central processing unit 118 and field programmable gate arrays 122 are connected to one other and are connected to a memory interface controller 112. The FPGA is connected to the memory interface through a programmable logic circuit to memory interconnect 130. This additional device is utilized due to the fact that the FPGA is operating with a very large bandwidth and to minimize the circuitry utilized from the FPGA to perform memory tasks. The memory and interface controller 112 is additionally connected to persistent memory disk 110, system memory 114 and read only memory (ROM) 116.

The system of FIG. 1A may be utilized for programming and training the FPGA. The GPU functions well with unstructured data and may be utilized for training, once the data has been trained a deterministic inference model may be found and the CPU may program the FPGA with the model data determined by the GPU.

The memory interface and controller is connected to a central interconnect 124, the central interconnect is additionally connected to the GPU 120, CPU 118 and FPGA 122. The central interconnect 124 is additionally connected to the input and output interface 128 and the network interface 126.

Figure 2:
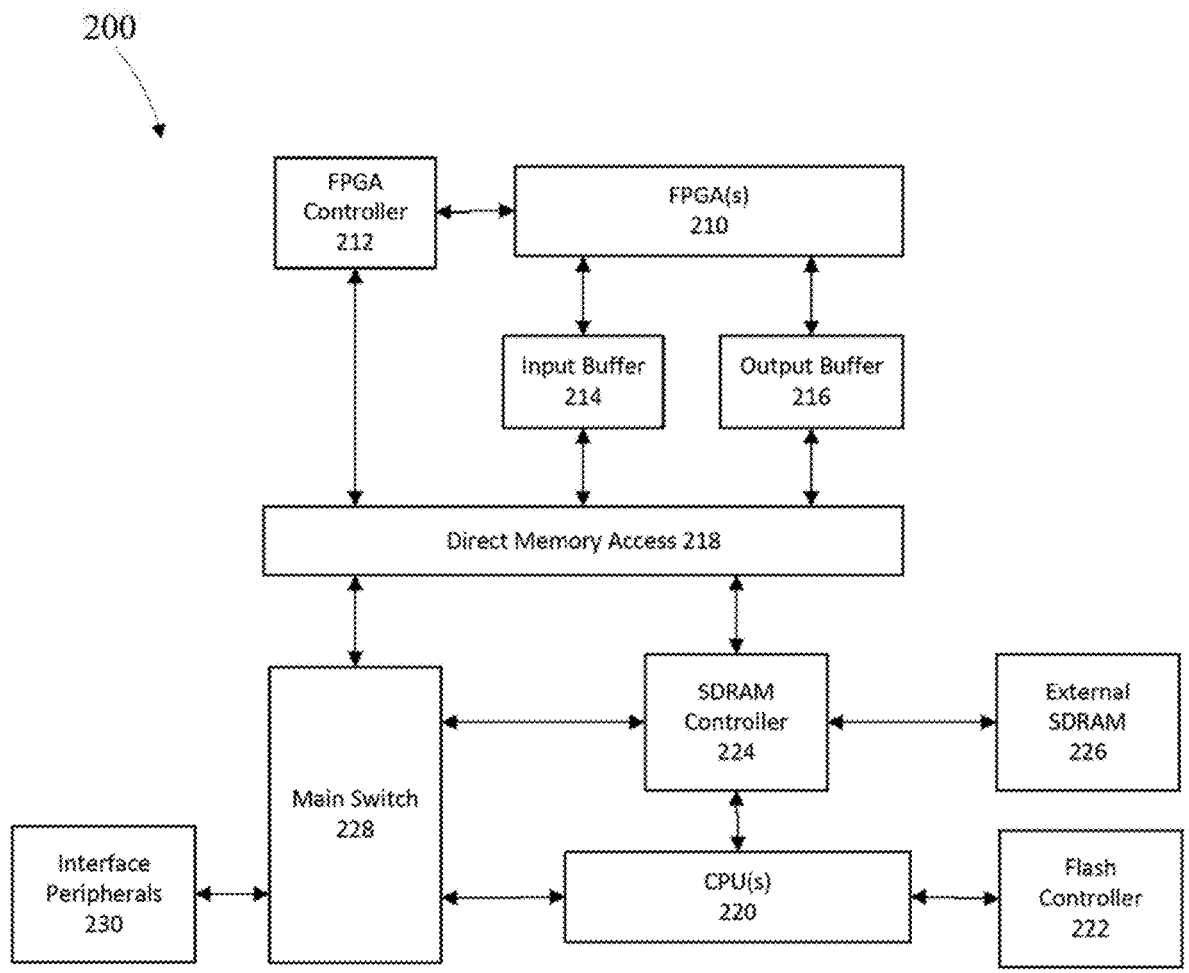
FIG. 2 is a second example system diagram in accordance with one embodiment of the disclosure.

FIG. 2 depicts a second example hybrid computational system 200 that may be used to implement neural nets associated with the operation of one or more portions or steps of process 600. In this example, the processors associated with the hybrid system comprise a field programmable gate array (FPGA) 210 and a central processing unit (CPU) 220.

The FPGA is electrically connected to an FPGA controller 212 which interfaces with a direct memory access (DMA) 218. The DMA is connected to input buffer 214 and output buffer 216, both of which are coupled to the FPGA to buffer data into and out of the FPGA respectively. The DMA 218 has two first in first out (FIFO) buffers one for the host CPU and the other for the FPGA, the DMA allows data to be written to and read from the appropriate buffer.

On the CPU side of the DMA are a main switch 228 which shuttles data and commands to the DMA. The DMA is also connected to an SDRAM controller 224 which allows data to be shuttled to and from the FPGA to the CPU 220, the SDRAM controller is also connected to external SDRAM 226 and the CPU 220. The main switch 228 is connected to the peripherals interface 230. A flash controller 222 controls persistent memory and is connected to the CPU 220.

The disclosure discusses possible multi-level hierarchy memory systems. In one example shown in FIG. 3 the system has four levels, an external random access memory 310, an on-chip shared random access memory for weight 312 and activation data 314, a shared buffer 318 which is shared by multiple arrays, output buffer 320, input data buffer 322 and result buffer 324. This architecture may provide a balance of power consumption and sustainable memory bandwidth.

Memory power consumption is proportional to access width, frequency of access, operational frequency, data travel distance from memory to computation element and memory location. Access to off-chip random access memory is high frequency and high power-consumption. Wide data access to large on-chip shared memories is highly power-consumptive.

One possible solution is to restrict high frequency access to local random access memories and tightly couple the memories with the multiply accumulate array to minimize power consumption while delivering high bandwidth. Another possible solution is to utilize intelligent scheduling to minimize access to large memories.

Figure 3:
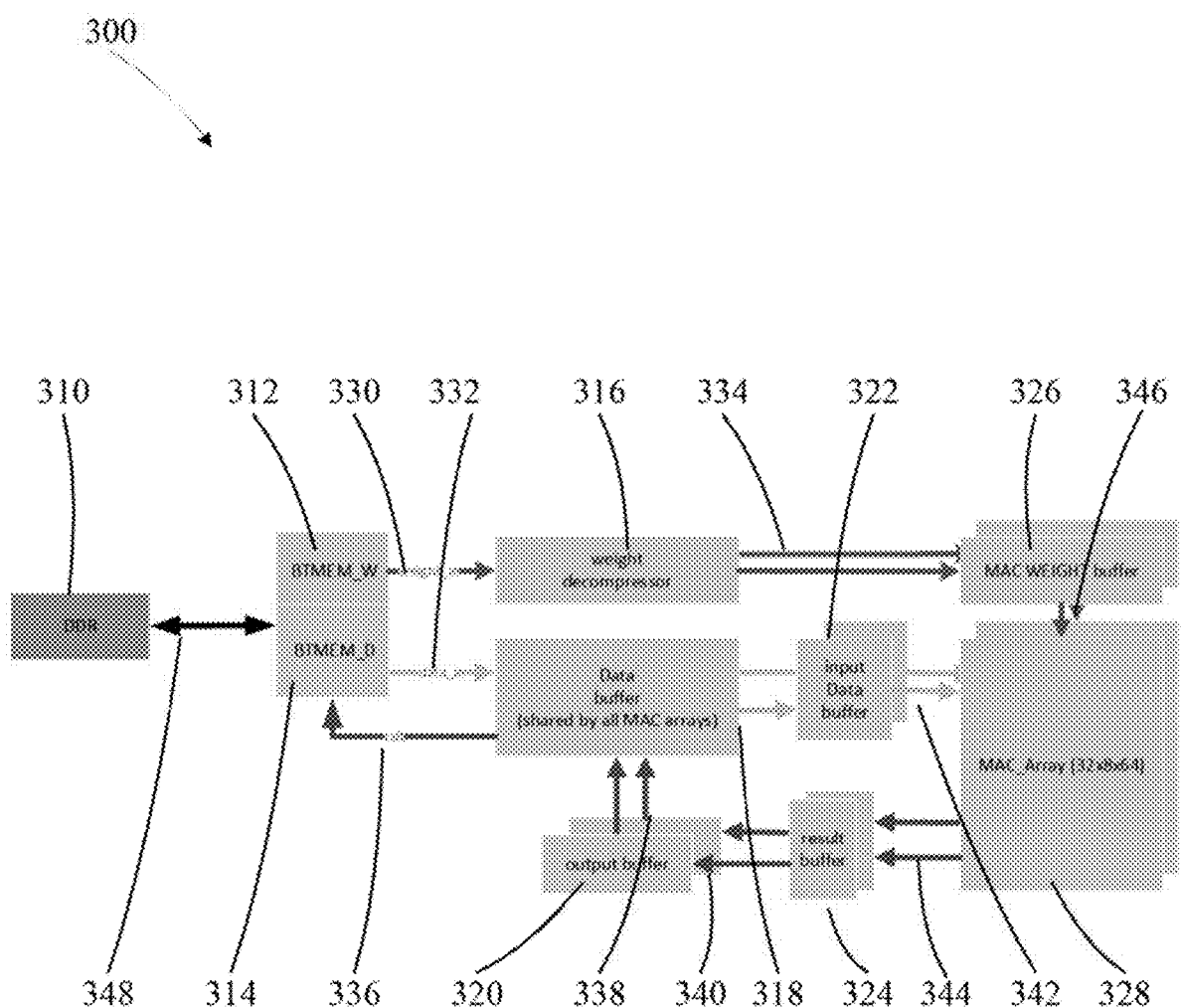
FIG. 3 is a an example adaptive memory hierarchy in accordance with one embodiment of the disclosure.

In FIG. 3 element 348 depicts the data path to and from the external random access memory. Elements 330, 334 and 346 depict the weight read path. Elements 332, 318 and 342 depict the activation data input path. Elements 336, 338, 340 and 344 depict the activation data write back to the bit test memory (BTMEM).

One possible memory hierarchy breaks up the data/weight input into multiple logical partitions to reduce more expensive memory access, i.e. random access memory and or BTMEM, and increase data reuse with minimum memory cost.

The network is divided into different sections, external dynamic ram 310, bit transfer memory for the weights (BTMEM_W) 312, bit transfer memory for the activation data (BTMEM_D) 314, weight decompression 316, shared data buffer 318, output buffer 320, input data buffer 322, result buffer 324 and the multiply accumulate array 328.

Figure 4:
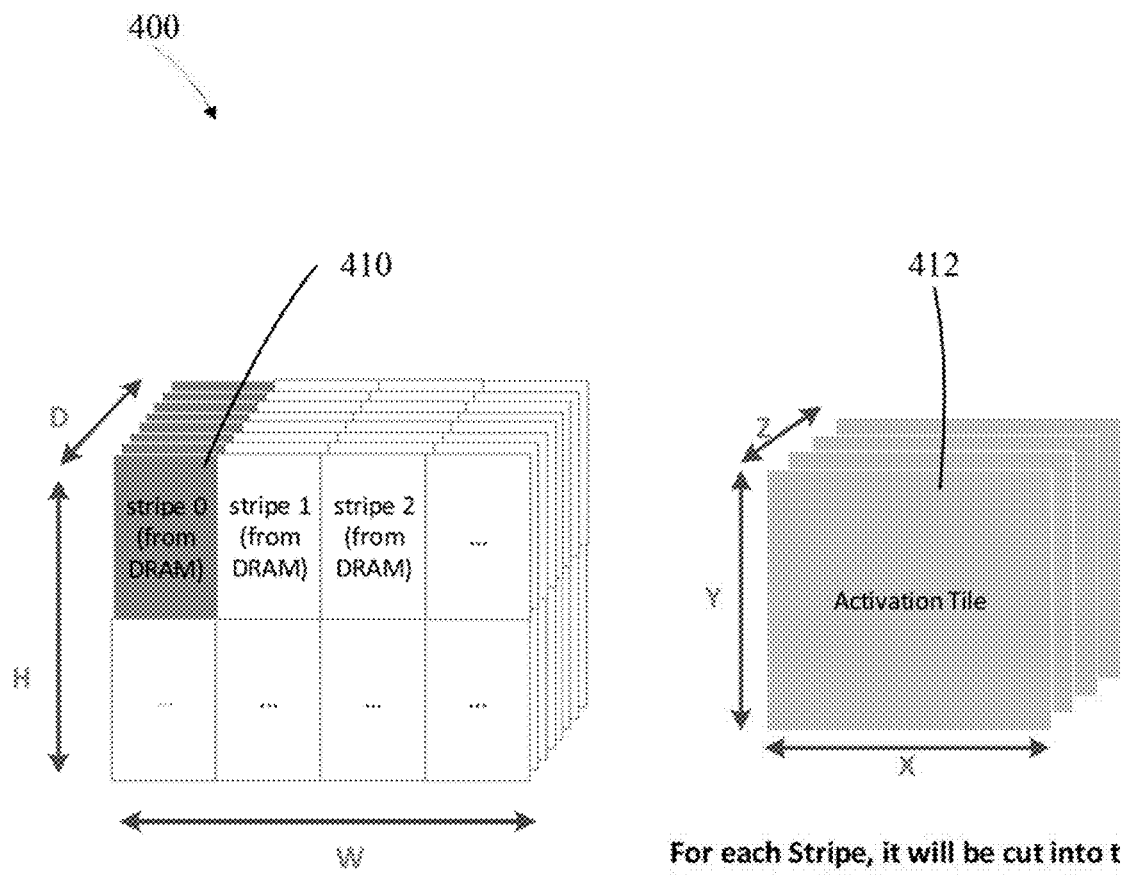
FIG. 4 is a first example of memory stripes and memory tiles in accordance with one embodiment of the disclosure.

The input activation data is partitioned into multiple stripes FIG. 4, 410, so that striped data may fit on-chip SRAM, bit test data memory (BTMEM_D). The intermediate layer's output data 344 for the stripes are looped back as input data 342 for next layer, forming a chained processing order, which greatly reduces the random access memory access.

The per section filter weights fit into the bit test weight memory (BTMEM_W) in a highly compressed format and are decompressed by the weight decompressor 316 and sent 334 to the MAC weight buffer 326. Stripes within the section reuse the same filter weights, which greatly reduces the external RAM access.

Stripes FIG. 4, 410 may be further partitioned into tiles FIG. 4, 412 to increase local accumulation and cut execution latency. In one example, the intermediate result of processing one input tile is saved in result buffer FIG. 3, 324 and only a final result FIG. 3 340 is sent to output buffer FIG. 3, 320 before being written back to the shared data buffer FIG. 3, 318.

The input activation data is 3D per layer within a batch. Different engines read the data in different orders such as depth to width to height (D→W→H) or width to height to depth (W→H→D) for different levels of memory and from different starting coordinates.

Figure 5:
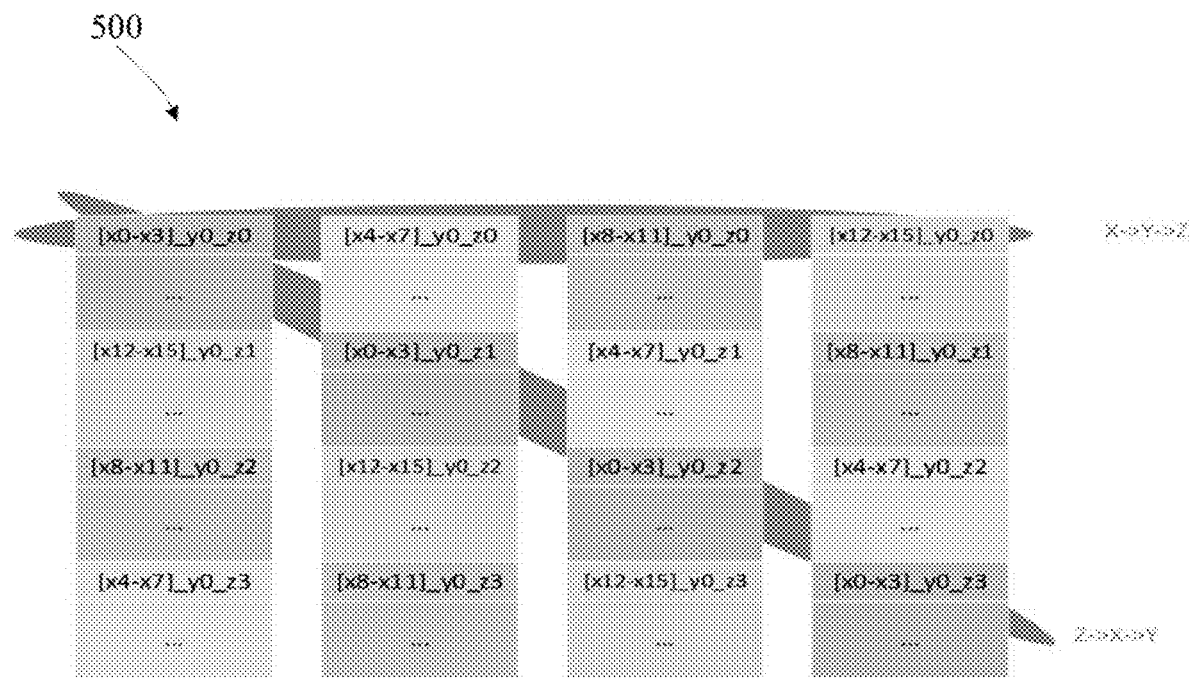
FIG. 5 is a second example of multiple memory striping in accordance with one embodiment of the disclosure.

For example, the different stripes in FIG. 5 may have different starting coordinates. FIG. 5 illustrates rotating offset, showing four memory banks.

Figure 6:
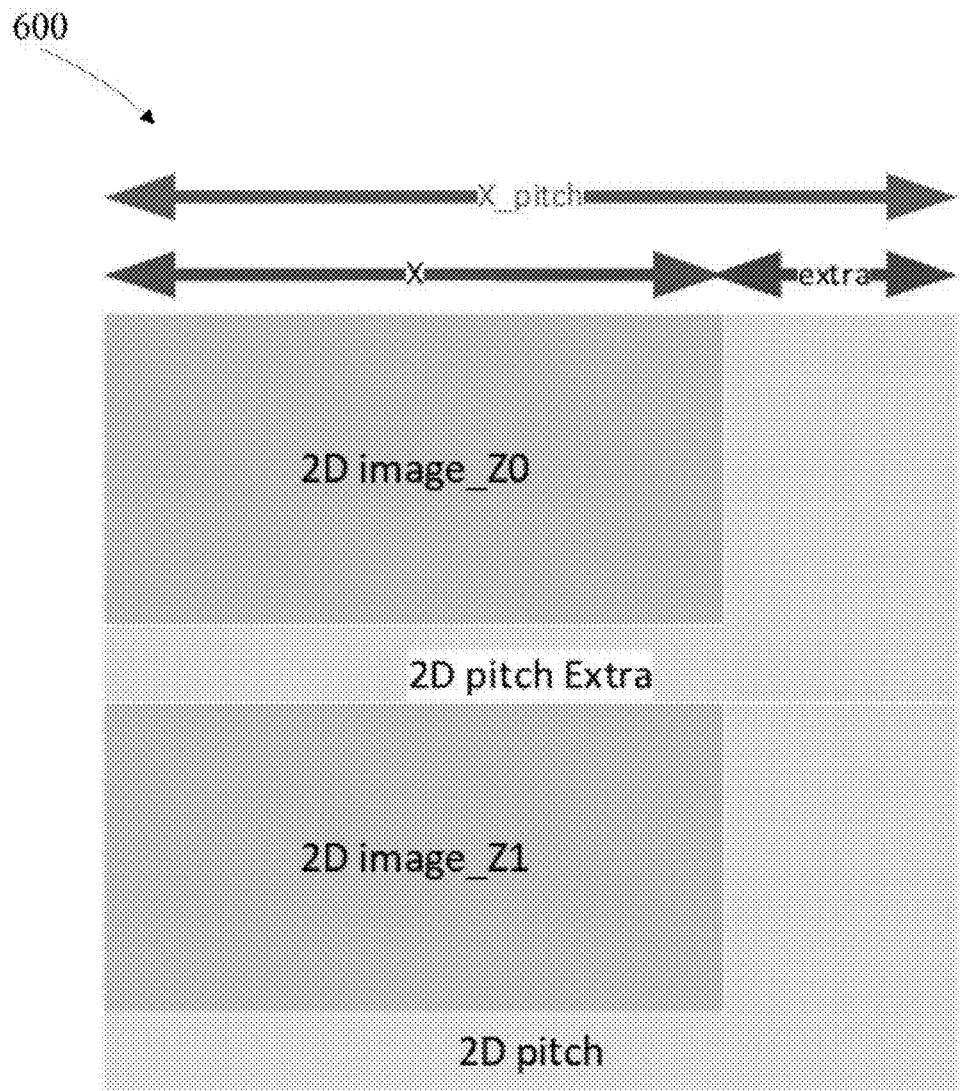
FIG. 6 is a third example of a memory layout in accordance with one embodiment of the disclosure.
Figure 7:
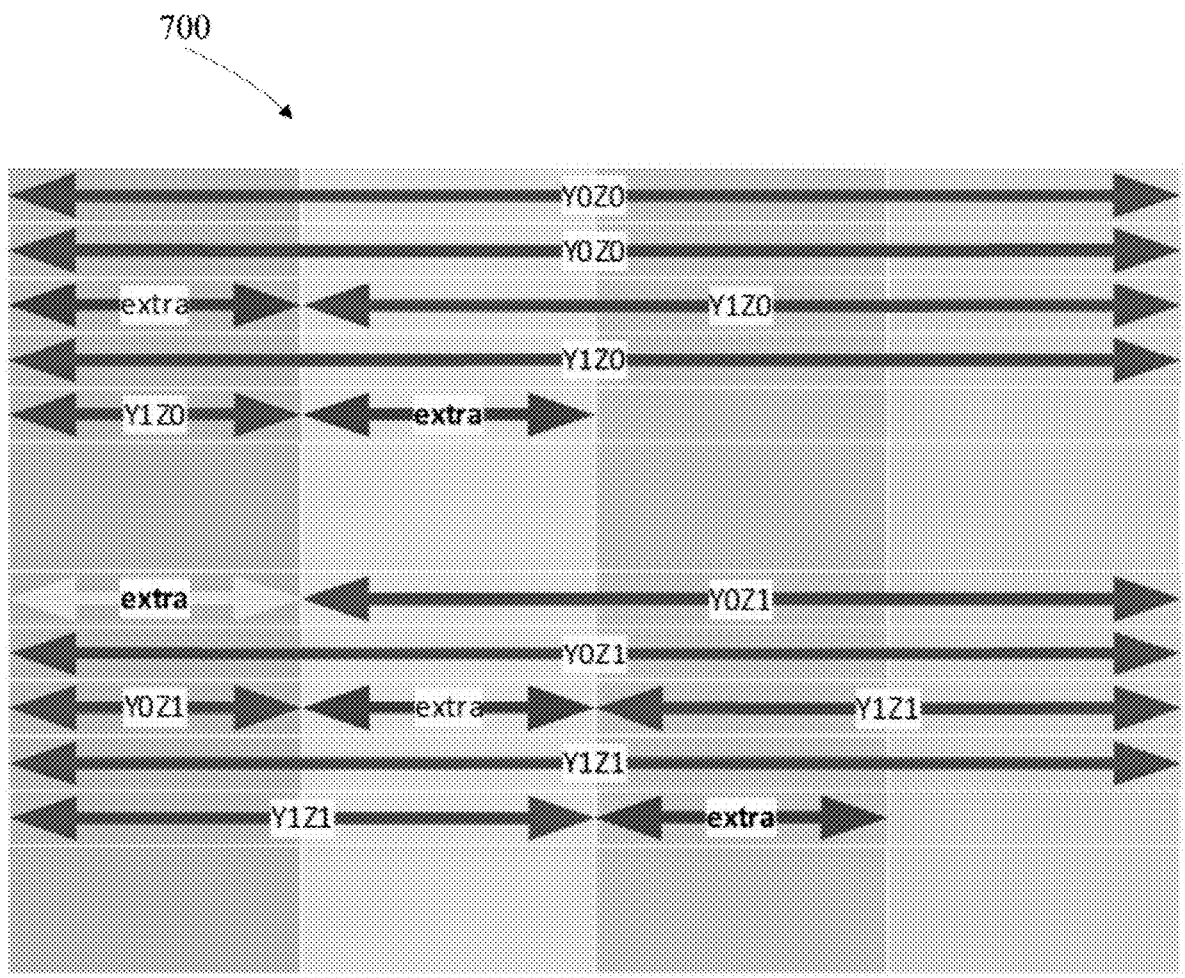
FIG. 7 is a fourth example of a memory layout in accordance with one embodiment of the disclosure.

To support very high bandwidth access, example memory organization schemes may utilize multiple banked memories with either rotating offset as shown in FIG. 5 or data swizzle as shown in FIGS. 6 and 7.

FIGS. 6 and 7 depict data swizzle that supports different read orders by giving the same physical address for X→Y→Z read for different addresses across memory bank for Z→X→Y order. In FIGS. 6 and 7 unaligned data pitch is shown. By utilizing a small memory percentage of memory overhead, highlighted as extra in FIGS. 6 and 7, an unaligned pattern is achieved so that read access X-Y-Z, Y-X-Z or Z-X-Y order is obtained by giving different addresses to different memory banks.

Figure 8:
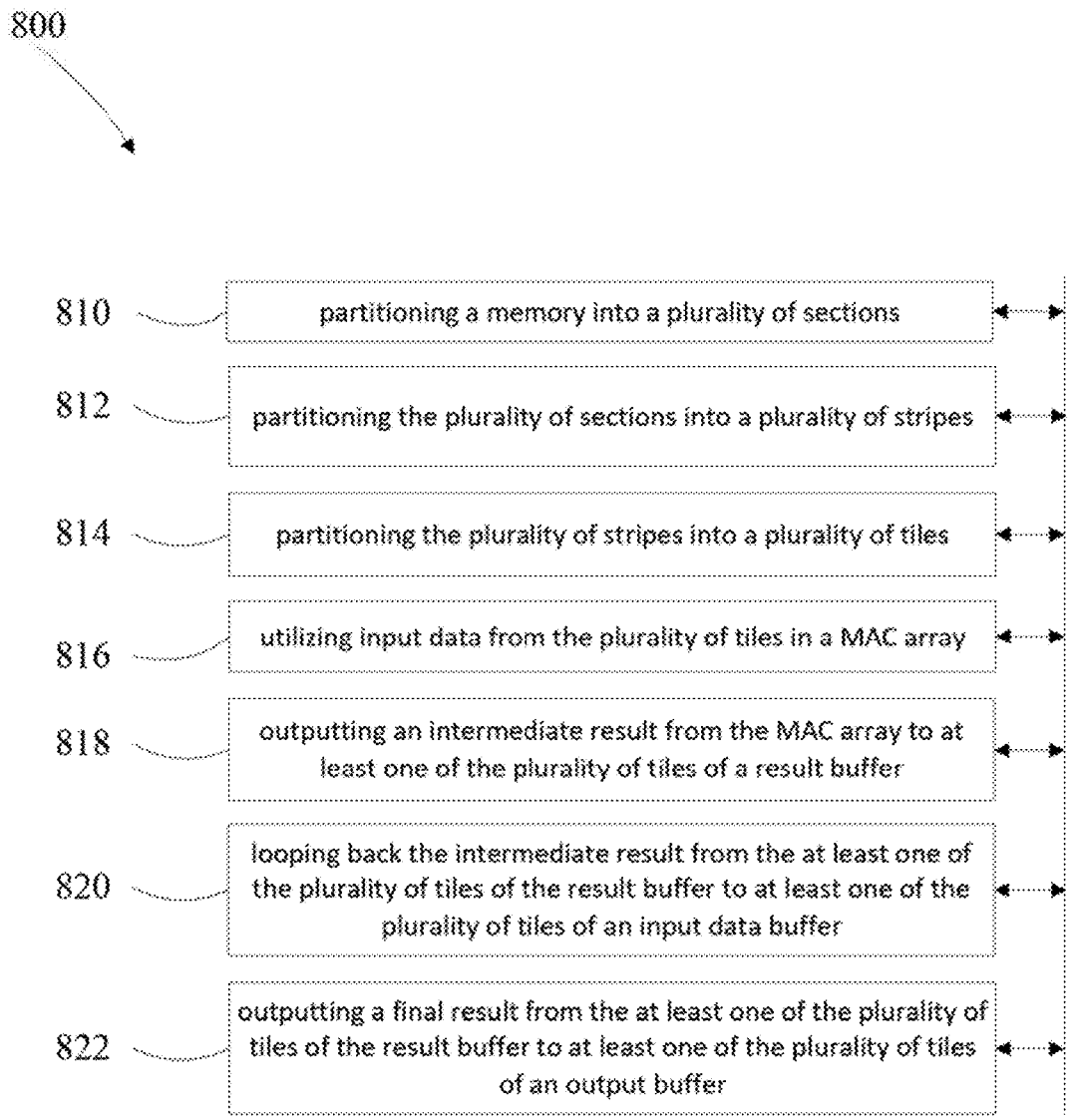
FIG. 8 is a first example method of memory hierarchy in accordance with one embodiment of the disclosure.

FIG. 8 depicts a first example method of memory hierarchy including partitioning 810 a memory into a plurality of sections, as shown in FIG. 3, an external random access memory 310, an on-chip shared random access memory for weight 312 and activation data 314, a shared buffer by multiple arrays 318 and a local buffer to the output buffer 320, the input data buffer 322 and the result buffer 324. The method then includes partitioning 812 the plurality of sections into a plurality of stripes FIG. 4, 410, and partitioning 814 the plurality of stripes into a plurality of tiles FIG. 4, 412. The method then includes utilizing 816 input data from the plurality of tiles in a MAC array FIG. 3, 328 and outputting 818 an intermediate result from the MAC array to at least one of the plurality of tiles of a result buffer FIG. 3, 324 and looping back 820 the intermediate result from the at least one of the plurality of tiles of the result buffer to at least one of the plurality of tiles of an input data buffer FIG. 3, 322. The method then includes outputting 822 a final result from the at least one of the plurality of tiles of the result buffer to at least one of the plurality of tiles of an output buffer FIG. 3, 320.

Figure 9:
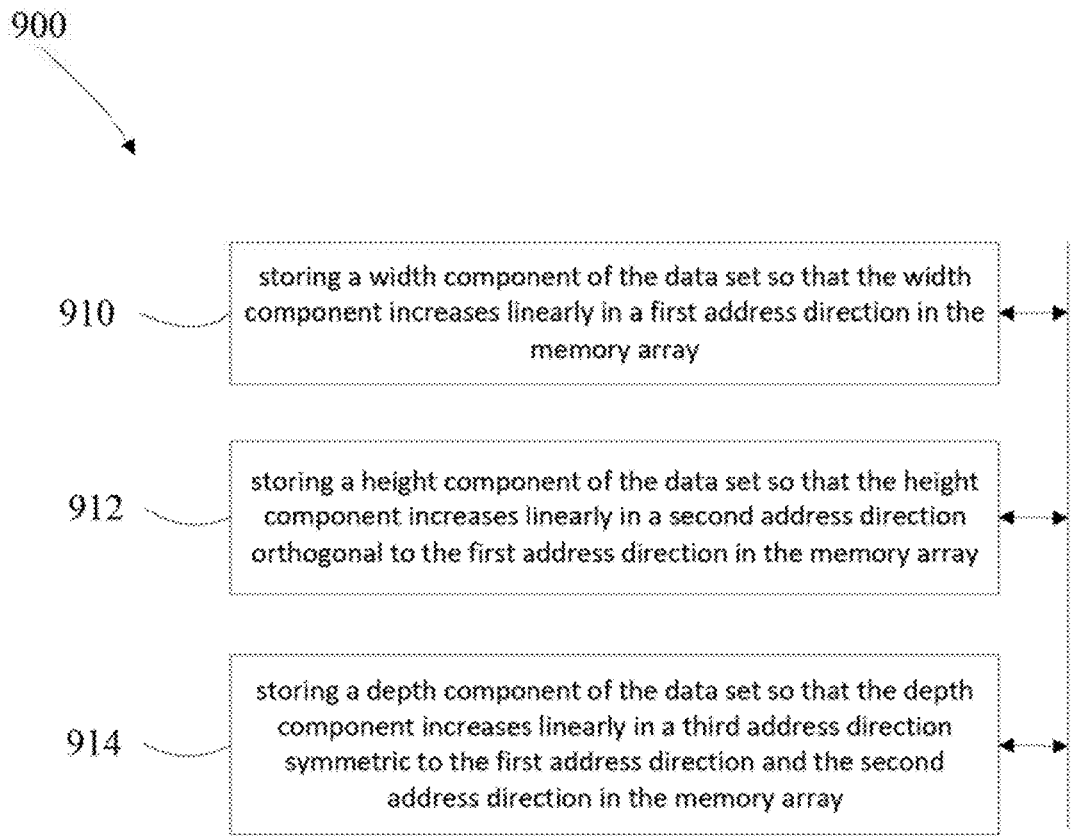
FIG. 9 is a second example method of memory hierarchy in accordance with one embodiment of the disclosure.

FIG. 9 depicts a second example method of memory hierarchy as shown in FIG. 5, 500 including storing 910 a width component of the data set so that the width component increases linearly in a first address direction in the memory array and storing 912 a height component of the data set so that the height component increases linearly in a second address direction orthogonal to the first address direction in the memory array. The method also includes storing 914 a depth component of the data set so that the depth component increases linearly in a third address direction symmetric to the first address direction and the second address direction in the memory array.

Figure 10:
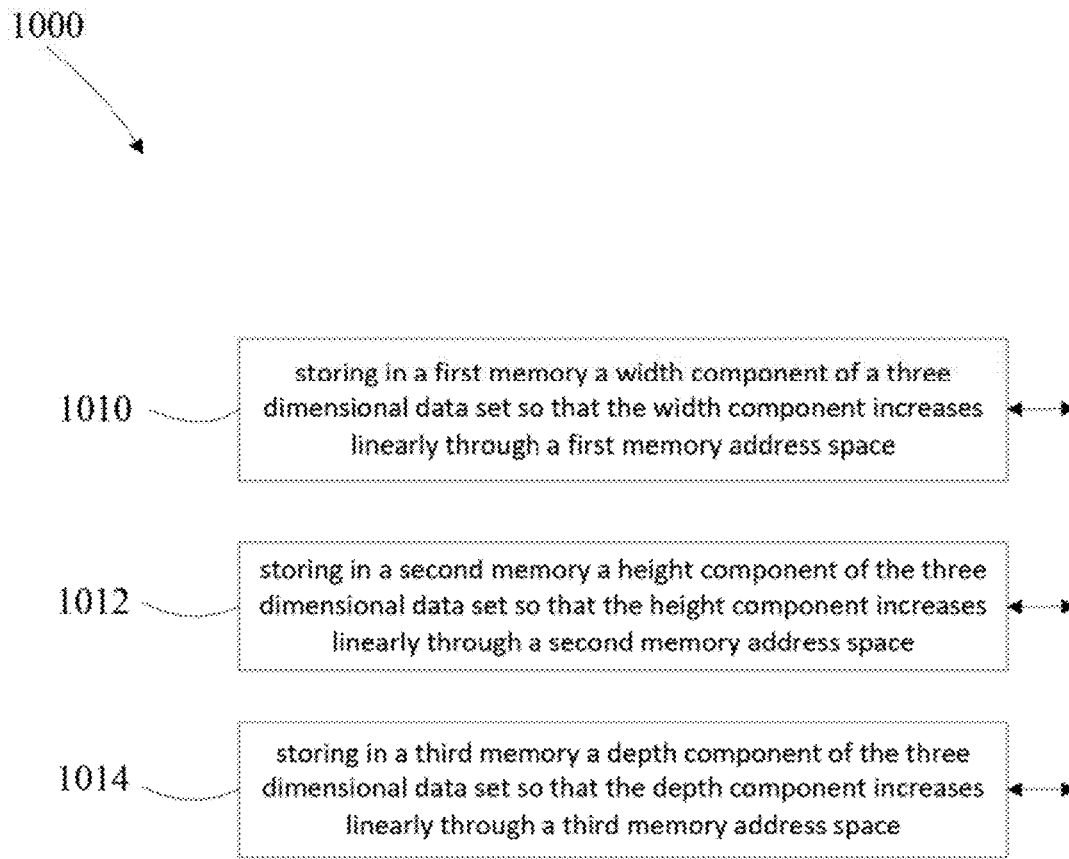
FIG. 10 is a third example method of memory hierarchy in accordance with one embodiment of the disclosure.

FIG. 10 depicts a third example method of memory hierarchy as shown in FIGS. 6, 600 and 7, 700 including storing 1010 in a first memory a width component of a three dimensional data set so that the width component increases linearly through a first memory address space, storing 1012 in a second memory a height component of the three dimensional data set so that the height component increases linearly through a second memory address space and storing 1014 in a third memory a depth component of the three dimensional data set so that the depth component increases linearly through a third memory address space.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

References to "one embodiment," "an embodiment," "some embodiments," "various embodiments", or the like indicate that a particular element or characteristic is included in at least one embodiment of the invention. Although the phrases may appear in various places, the phrases do not necessarily refer to the same embodiment. In conjunction with the present disclosure, those skilled in the art will be able to design and incorporate any one of the variety of mechanisms suitable for accomplishing the above described functionalities.

It is to be understood that the disclosure teaches just one example of the illustrative embodiment and that many variations of the invention can easily be devised by those skilled in the art after reading this disclosure and that the scope of then present invention is to be determined by the following claims.

What is claimed is:

1. A method of hierarchical structuring a multi-level memory in a convolutional neural network, comprising:
   partitioning a memory into a plurality of sections;
   partitioning the plurality of sections into a plurality of stripes;
   utilizing input data from the plurality of stripes in each of at least two multiply accumulate (MAC) arrays;
   outputting an intermediate result from the multiply accumulate (MAC) arrays to at least one of the plurality of stripes of a result buffer;
   looping back the intermediate result from the at least one of the plurality of stripes of the result buffer of a shared data buffer to at least one of the plurality of stripes of an input data buffer forming a chain process, wherein the shared buffer is shared by the at least two multiply accumulate (MAC) arrays;
   outputting a final result from the at least one of the plurality of stripes of the result buffer to at least one of the plurality of stripes of an output buffer;
   partitioning a multiply accumulate (MAC) weight buffer section;
   partitioning an input data buffer section;
   partitioning a result buffer section;
   partitioning an output buffer section;
   partitioning a shared data buffer section;
   partitioning a bit test weight memory section;
   partitioning a bit test data memory section;
   partitioning an external random access memory section;
   partitioning the input data buffer section into a plurality of input buffer data stripes;
   partitioning the result buffer section into a plurality of result buffer stripes;
   partitioning the output buffer section into a plurality of output buffer stripes;
   partitioning the shared data buffer section into a plurality of shared data stripes;
   partitioning the bit test data memory section into a plurality of bit test data memory stripes;
   receiving the bit test weights and the input data from the external random access memory section;
   decompressing the received bit test weights from the bit test weight memory section; and
   storing the decompressed bit test weights from the bit test weight memory section in the multiply accumulate (MAC) weight buffer section;
   importing input data from the bit test data memory section to at least one of the plurality of stripes of the shared data buffer section;
   importing the input data from the at least one of the plurality of stripes of the shared data buffer section to the at least one of the plurality of stripes of the input data buffer section; and
   receiving weights from the multiply accumulate (MAC) weight buffer section and the input data buffer section at the multiply accumulate (MAC) arrays.

2. The method of hierarchical structuring the multi-level memory of claim 1, further comprising:
   outputting the final result from the at least one of the plurality of stripes of the output buffer section to the at least one of the plurality of stripes of the shared data buffer section;
   outputting the final result from the at least one of the plurality of stripes of the shared data buffer section to the at least one of the plurality of stripes of the bit test data memory section; and
   outputting the final result from the at least one of the plurality of stripes of the bit test data memory section to the external random access memory section.

3. The method of hierarchical structuring the multi-level memory of claim 2, further comprising:
   outputting the final result from the at least one of the plurality of stripes of the output buffer section to the at least one of the plurality of stripes of the shared data buffer section;
   outputting the final result from the at least one of the plurality of stripes of the shared data buffer section to the at least one of the plurality of stripes of the bit test data memory section; and
   outputting the final result from the at least one of the plurality of stripes of the bit test data memory section to the external random access memory section.

4. The method of hierarchical structuring the multi-level memory of claim 3, further comprising:
   storing a width component of a data set so that a width component increases linearly in a first address direction in a memory array;
   storing a height component of the data set so that a height component increases linearly in a second address direction orthogonal to the first address direction in the memory array; and
   storing a depth component of the data set so that a depth component increases linearly in a third address direction symmetric to the first address direction and the second address direction in the memory array.

5. The method of hierarchical structuring the multi-level memory of claim 3, further comprising:
   storing a width component of a data set so that a width component increases linearly in a first address direction in a memory array;
   storing a height component of the data set so that a height component increases linearly in a second address direction orthogonal to the first address direction in the memory array; and
   storing a depth component of the data set so that a depth component increases linearly in a third address direction symmetric to the first address direction and the second address direction in the memory array.

6. A method of hierarchical structuring a multi-level memory in a convolutional neural network, comprising:
partitioning a memory into a plurality of sections;
partitioning the plurality of sections into a plurality of stripes;
utilizing input data from the plurality of stripes in each of at least two multiply accumulate (MAC) arrays;
outputting an intermediate result from the multiply accumulate (MAC) arrays to at least one of the plurality of stripes of a result buffer;
looping back the intermediate result from the at least one of the plurality of stripes of the result buffer of a shared data buffer to at least one of the plurality of stripes of an input data buffer forming a chain process, wherein the shared buffer is shared by the at least two multiply accumulate (MAC) arrays;
outputting a final result from the at least one of the plurality of stripes of the result buffer to at least one of the plurality of stripes of an output buffer;
partitioning a multiply accumulate (MAC) weight buffer section;
partitioning an input data buffer section;
partitioning a result buffer section;
partitioning an output buffer section;
partitioning a shared data buffer section;
partitioning a bit test weight memory section;
partitioning a bit test data memory section;
partitioning an external random access memory section;
partitioning the input data buffer section into a plurality of input buffer data stripes;
partitioning the result buffer section into a plurality of result buffer stripes;
partitioning the output buffer section into a plurality of output buffer stripes;
partitioning the shared data buffer section into a plurality of shared data stripes;
partitioning the bit test data memory section into a plurality of bit test data memory stripes;
partitioning the plurality of input buffer data stripes into a plurality of input buffer data tiles;
partitioning the plurality of result buffer stripes into a plurality of result buffer tiles;
partitioning the plurality of output buffer stripes into a plurality of output buffer tiles;
partitioning the plurality of shared data stripes into a plurality of shared data tiles;
partitioning the plurality of bit test data stripes into a plurality of bit test data memory tiles;
importing input data from the bit test data memory section to at least one of the plurality of tiles of the shared data buffer section;
importing the input data from the at least one of the plurality of tiles of the shared data buffer section to the at least one of the plurality of tiles of the input data buffer section; and
receiving weights from the multiply accumulate (MAC) weight buffer section and the input data buffer section at the multiply accumulate (MAC) arrays.

7. The method of hierarchical structuring the multi-level memory of claim 6, further comprising:
outputting the final result from the at least one of the plurality of tiles of the output buffer section to the at least one of the plurality of tiles of the shared data buffer section;
outputting the final result from the at least one of the plurality of tiles of the shared data buffer section to the at least one of the plurality of tiles of the bit test data memory section; and
outputting, the final result from the at least one of the plurality of tiles of the bit test data memory section to the external random access memory section.

8. The method of hierarchical structuring the multi-level memory of claim 7, further comprising;
storing a width component a data set so that a width component increases linearly in a first address direction in a memory array;
storing a height component of the data set so that a height component increases linearly in a second address direction orthogonal to the first address direction in the memory array; and
storing a depth component of the data set so that a depth component increases linearly in a third address direction symmetric to the first address direction and the second address direction in the memory array.

9. The method of hierarchical structuring the multi-level memory of claim 7, further comprising:
storing a width component of a data set so that a width component increases linearly in a first address direction in a memory array;
storing a height component of the data set so that a height component increases linearly in a second address direction orthogonal to the first address direction in the memory array; and
storing a depth component of the data set so that a depth component increases linearly in a third address direction symmetric to the first address direction and the second address direction in the memory array.

* * * * *